(12) United States Patent
Storakers

(10) Patent No.: US 7,747,916 B2
(45) Date of Patent: Jun. 29, 2010

(54) JTAG INTERFACE

(75) Inventor: Dan Storakers, Sollentuna (SE)

(73) Assignee: Infineon Technologies AG, Neubiberg (DE)

( * ) Notice: Subject to any disclaimer, the term of this patent is extended or adjusted under 35 U.S.C. 154(b) by 275 days.

(21) Appl. No.: 11/748,415

(22) Filed: May 14, 2007

(65) Prior Publication Data

US 2008/0288823 A1 Nov. 20, 2008

(51) Int. Cl.
*G01R 31/3183* (2006.01)
*G01R 31/40* (2006.01)

(52) U.S. Cl. ..................... 714/726; 714/724

(58) Field of Classification Search .................... None
See application file for complete search history.

(56) References Cited

U.S. PATENT DOCUMENTS

| | | | |
|---|---|---|---|
| 5,521,556 A * | 5/1996 | O'Shaughnessy et al. | 331/1 R |
| 6,020,760 A * | 2/2000 | Sample et al. | 326/41 |
| 6,381,717 B1 * | 4/2002 | Bhattacharya | 714/724 |
| 7,345,502 B1 * | 3/2008 | Lakkapragada et al. | 326/8 |
| 2004/0264223 A1 * | 12/2004 | Pihlstrom et al. | 363/89 |
| 2005/0160337 A1 * | 7/2005 | Whetsel | 714/726 |
| 2006/0156112 A1 * | 7/2006 | Whetsel | 714/724 |

FOREIGN PATENT DOCUMENTS

| | | |
|---|---|---|
| DE | 60110514 T2 | 1/2006 |
| DE | 102004043063 A1 | 3/2006 |

OTHER PUBLICATIONS

Tietze et al, "Halbleiter-Schaltungstechnik" 8th revised edition, Springer-Verlag 1986, Berlin, 1986, pp. 222-224.
"IEEE Standard Test Access Port and Boundary-Scan Architecture", Test Technology Standards Committee of the IEEE Computer Society, IEEE Std 1149.1—Feb. 15, 1990 (includes Std 1149.1a—Jun. 17, 1993), The Institute of Electrical and Electronics Engineers, Inc., Copy right 1993, pp. 1-1 to 1-5, 3-1 to 3-9, 4-1 to 4-3, 5-1 to 5-16, and 8-1 to 8-3.

* cited by examiner

*Primary Examiner*—Kevin L Ellis
*Assistant Examiner*—Dipakkumar Gandhi
(74) *Attorney, Agent, or Firm*—Lee & Hayes, PLLC

(57) ABSTRACT

Implementations are presented herein that relate to improved Joint Test Action Group (JTAG) compatible devices.

14 Claims, 5 Drawing Sheets

JTAG INTERFACE

BACKGROUND

JTAG is a popular testing and device programming scheme. JTAG is an acronym that stands for the Joint Test Action Group, which was a technical subcommittee responsible for developing the IEEE standard 1149.1. The JTAG standard sets out a methodology for performing testing on complex integrated circuits and circuit boards. JTAG provides a strategy to ensure the integrity of individual components and the interconnections between them after installation on a printed circuit board. Generally, the JTAG standard has become widely adopted.

According to the JTAG standard (JTAG/IEEE Std 1149.1), the integrated circuit architecture for a JTAG compatible device has a test access port (TAP port), which requires the use of at least four pins. In particular, a test clock (TOK) pin receives a test clock signal for the device under test. A test mode select (TMS) pin accepts commands to select particular test modes. A test data in (TDI) pin accepts data into the device under test. A test data output (TDO) pin sends data out from the device under test. An optional fifth pin, identified as the test-reset (TRST), enables the reset of a JTAG controller (TAP controller) initialization without affecting other device or system logic. Therefore, a JTAG compatible device requires at least four dedicated pins, and five dedicated pins if a TRST pin is used.

Integrated circuits contain more and more functionality. This increase in functionality often increases the number of pins implemented by a given integrated circuit. Each pin employed by an integrated circuit raises the manufacturing costs associated with producing the integrated circuit. Accordingly, reducing the pin count associated with integrated circuits is often desirable if functionality is not compromised.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

In the following, a brief discussion of a conventional JTAG compatible device is provided. Thereafter, a brief discussion of the state machine of a conventional JTAG controller is given. Subsequently, a detailed description of an improved JTAG compatible device is provided. Both the system and method related details associated with the improved JTAG compatible device are provided herein.

An improved JTAG compatible device in accordance with an implementation described herein utilizes an integrated circuit pin that receives both the TMS and the TDI signals. Therefore, the improved JTAG compatible device in accordance with at least one implementation described herein eliminates the four pin requirement set forth in the IEEE JTAG standard. In particular, the improved JTAG compatible device includes a TMS/TDI input, a TCK input and a TDO input. Optionally, the improved JTAG compatible device includes a TRST input. Each of these inputs may be pins on a JTAG compatible integrated circuit, printed circuit board, or other like device.

Conventional JTAG Arrangement

Figure 1:
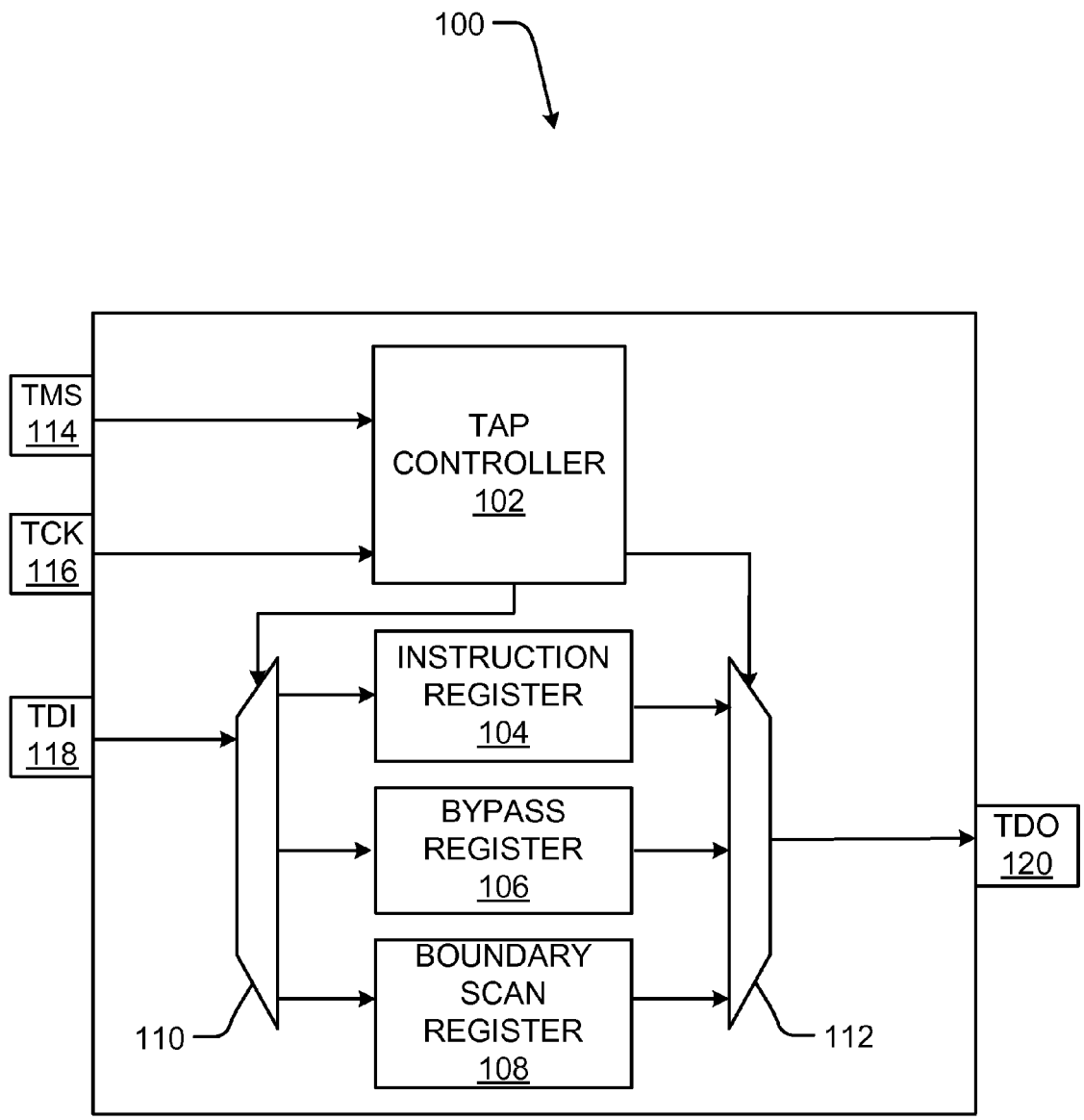
FIG. 1 is a diagram that illustrates a conventional JTAG compatible device.

FIG. 1 illustrates a conventional JTAG compatible device 100. The JTAG compatible device 100 includes a TAP controller 102. The TAP controller 102 is to generate clock and control signals required for an instruction register 104, a bypass register 106 and a boundary scan register 108. Two events can to trigger a change of the state of the TAP controller 102. The first event is a rising edge of a received test clock. The second event is a system power up. The control signals supplied by the TAP controller 102 assure proper input and output interfacing for the registers 104 106 or 108 using multiplexers 110 and 112.

The conventional JTAG compatible device 100 includes a TMS pin 114 coupled to the TAP controller 102. Logic signals (0s and 1s) received at the TMS pin 114 are interpreted by the TAP controller 102 to control the test operations. The TMS signals are sampled at the rising edge of TCK pulses received on a TCK pin 116. The signals received on the TMS pin 114 are decoded by the TAP controller 102 to generate the required control signals inside the conventional JTAG device 100. The TMS 114 pin is held high when it is not being driven.

A TDI pin 118 is interfaced with one of the registers 104, 106 or 108, depending on the state of the TAP controller 102. Serial input data applied to the TDI pin 118 may be fed to a register (104, 106, 108) selected by the TAP controller 102. Data is shifted in through the TDI pin 118 at a rising edge of the TCK pulses. The TDI pin 118 is held high when it is not being driven.

A TDO pin 120 serves as an output for one of the registers 104, 106, or 108, depending on the state of the TAP controller 102. Data is shifted out through the TDO pin 120 at a falling edge of the TCK pulses. The TDO pin 120 may remain in a tri-state condition at all other times.

Figure 2:
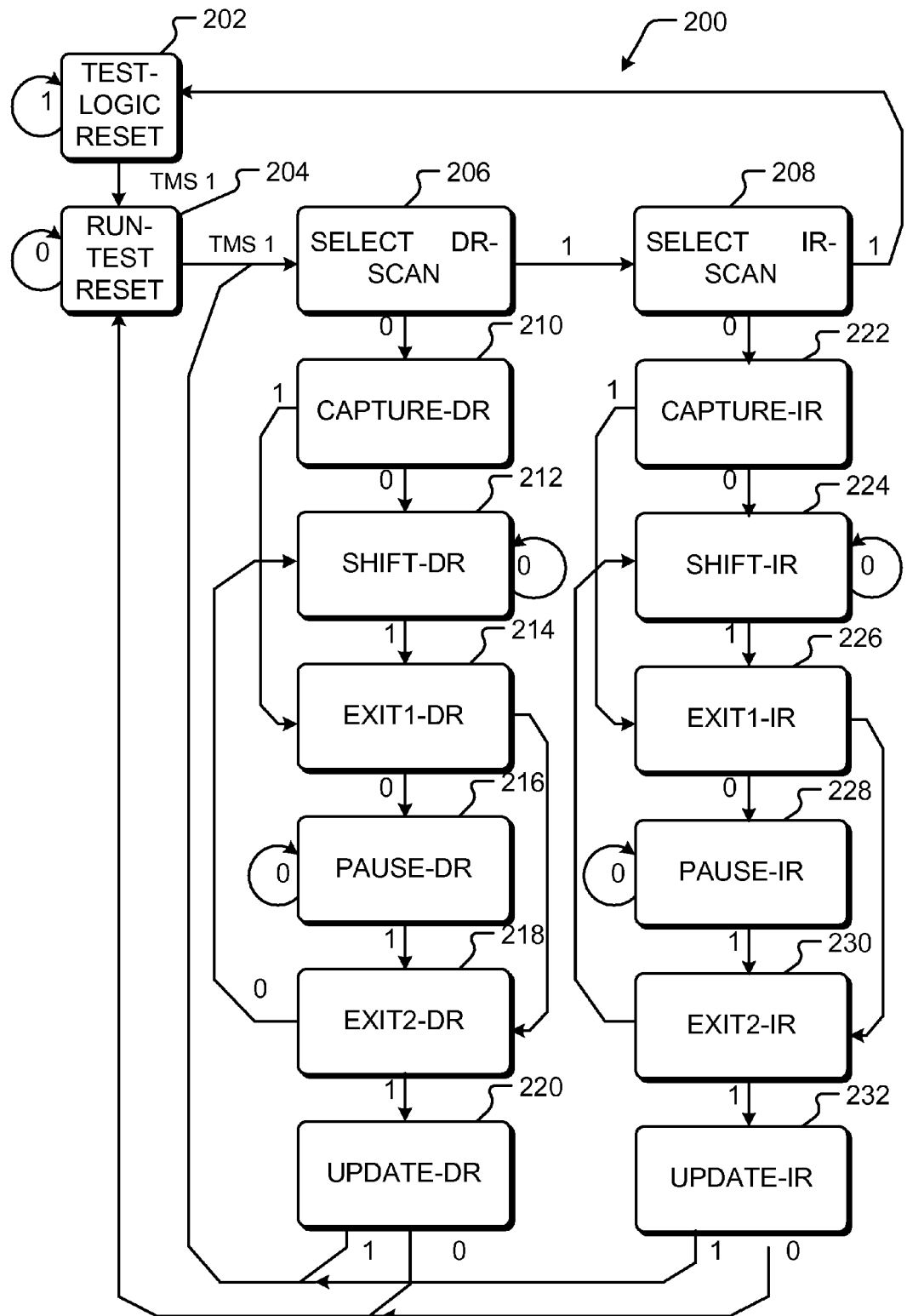
FIG. 2 illustrates a state transition diagram for the state machine of a conventional JTAG controller.

FIG. 2 illustrates a 16-state finite state machine 200 that is implemented by the TAP controller 102. The state machine 200 shows the various operational states of the JTAG compatible device 100. The operational states illustrated in FIG. 2 are specified in the JTAG standard.

One function of the state machine 200 is to control how data is scanned into the instruction register 104 and the data registers (i.e., the bypass register 106 or the boundary scan register 108). The state of the TMS signal at the rising edge of the TCK pulses determines the sequence of transitions. The zeros and ones shown in FIG. 2 indicate the transitions of the state machine 200 based on whether the TMS signal is at logic level high or a logic level low.

The state machine is initialized by entering a test-logic reset state 202. After that, a run-test/idle state 204 is entered upon transition to a low logic level on the TMS signal. As is shown in FIG. 2, there are two main state sequences. The first is for shifting data into one of the data registers, and the second is for shifting an instruction into the instruction register 104.

After the state machine 200 is in the run-test/idle state 204, a select DR-scan state 206 is initiated by inserting a logic level high on the TMS signal for one clock cycle only. A select IR-scan state 208 is initiated by inserting a logic level high on the TMS signal for two clock cycles.

If the select DR-scan 206 is initiated, the state machine 200 may enter a capture-DR state 210, a shift-DR-state 212, an exit1-DR state 214, a pause-DR state 216, an exit2-DR state 218 and an update-DR state 220 by asserting the appropriate logic levels shown in FIG. 2 on the TMS signal. If the select IR-scan state 208 is initiated, the state machine may enter a capture-IR state 222, a shift-IR state 224, an exit1-IR state 226, a pause-IR state 228, an exit2-IR state 230 and an update-IR state 232 by asserting the appropriate logic level shown in FIG. 2 on the TMS signal.

A brief description of all the various states of the finite state machine 200 is not provided. Only those states in which the TDI and TDO pins are coupled together are described.

In the shift-IR state, the instruction register 104 is connected between the TDI and TDO pins 118 and 120. Shifts occur on each rising edge of the TCK pulses towards an output of the instruction register 104. The rising edge of the TCK pulses also shifts new instruction bits into the instruction register 104.

In the shift-DR state, a data register (e.g., the bypass register 106 or the boundary scan register 108) is connected between the TDI and TDO pins 118 and 120. As a result of a current instruction, data is shifted towards an output of the data register on each rising edge of the TCK pulses. At the same time, data is shifted into the data register by way of the TDI pin 118.

The pause-IR state allows the shifting of the instruction register 104 to be temporarily halted. This state is maintained while the TMS signal is that a low level.

The pause-DR state allows the shifting of a data register (e.g., the bypass register 106 or the boundary scan register 108) to be temporarily halted. This state is maintained while the TMS signal is at a low level.

Additional details related to the JTAG standard may be obtained by reading documents associated with the IEEE 1149.1 standard.

Exemplary Arrangements

Figure 3:
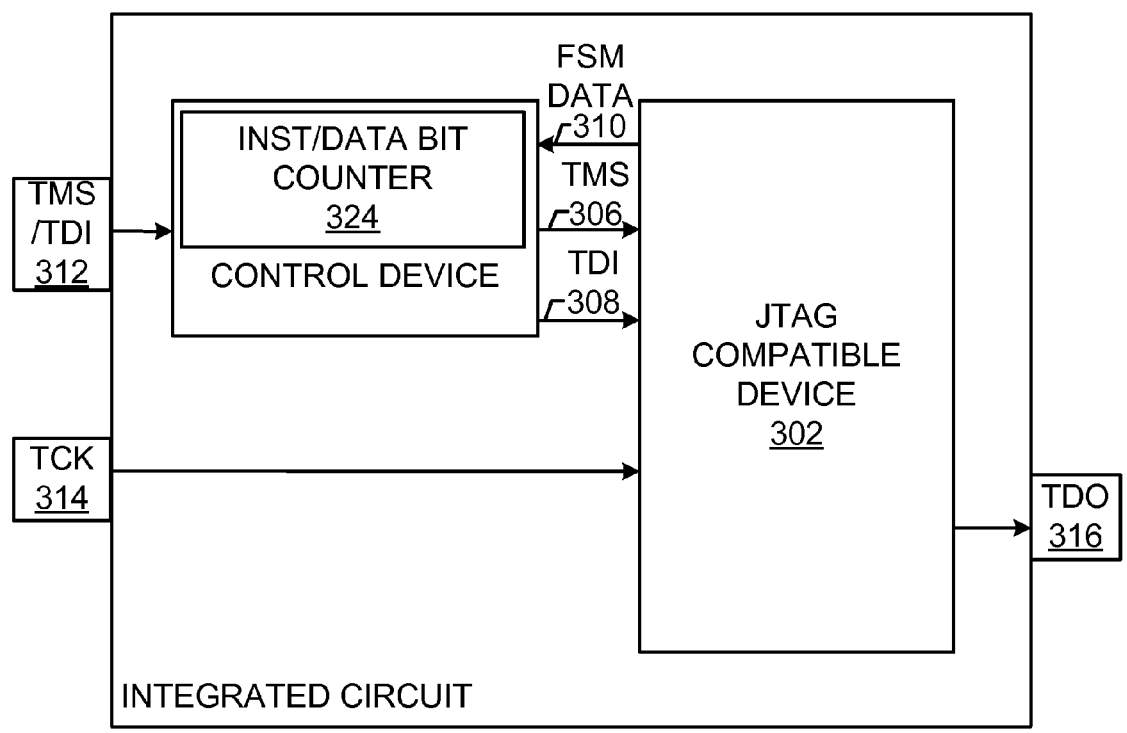
FIG. 3 illustrates an improved JTAG compatible device in accordance with an implementation described herein.

FIG. 3 illustrates an improved JTAG compatible device 300 in accordance with one embodiment described herein. In the exemplary implementation illustrated in FIG. 3, the JTAG compatible device 300 is an integrated circuit (IC). The JTAG compatible device 300 may also be a printed circuit board, a consumer device such as a computer, wireless phone, or other like device.

The IC 300 may include a JTAG compatible device 302 similar to the JTAG compatible device 100 illustrated in FIG. 1. A control device 304 may be included in the IC 300. The control device 304 may be interfaced with the JTAG compatible device 302, and is capable of sending TMS and TDI signals to the JTAG compatible device 302 through signal lines 306 and 308, respectively. The control device 304 may receive finite state machine data from the JTAG compatible device 302 over a signal line 310. The finite state machine data may be generated by a TAP controller of the JTAG compatible device 302. Such a TAP controller is illustrated in FIG. 1; see TAP controller 102.

The IC 300 includes at least three distinct pins (312, 314 and 316) that are usable to process JTAG related signals. The TMS/TDI pin 312 may be used to receive TMS or TDI signals. Signals received on the TMS/TDI pin 312 may be sent to the control device 304 over a signal line 318. The TCK pin 314 may be used to receive TCK pulses. The TCK pulses received on the TCK pin 314 may be communicated to the JTAG compatible device 302 over a signal line 320. The TDO pin 316 is coupled to a TDO output of the JTAG compatible device 302, via a signal line 322.

Unlike conventional JTAG compatible devices, the IC 300 is capable of operating in accordance with the JTAG standard even though the normally separate TMS and TDI pins are combined using the TMS/TDI pin 312. As will be described in further detail below, the control device 304 makes the use of the combined TMS/TDI pin 312 possible. Because TMS and TDI signals are not communicated simultaneously, the TMS/TDI pin 312 may receive both the TMS and the TDI signals. The control device 304 is responsible for determining which type of signal (TMS or TDI) is being communicated over the signal line 318. The control device 304 uses the finite state machine data received on the signal line 310, at least in part, to determine if a TMS signal or a TDI signal has been received at the TMS/TDI pin and 312.

As the default, the control device 304 has the TMS signal line 306 enabled. The control device 304 may maintain this state until finite state machine data is received on the signal line 310 that indicates one of five looped states. These so-called looped states occur when the TMS signal is at a logic level low, and when this logic level low causes a current state to remain unchanged. Referring to FIG. 2, the so-called looped states include the shift-DR-state 212 and the shift-IR state 224. When the control device 304 receives information over the signal line 310, via the finite state machine data, that one of the five looped states is active, the control device 304 will output data received on the signal line 318 using the TDI signal line 308.

The control device 304 includes an instruction register/data register counter 324 that may be used to count the number of TDI bits received on the signal line 318 and passed by the control device 304 over the TDI signal line 308. The control device 304 uses the bit count data collected by the counter 324 to determine when to toggle back to outputting data received on the signal line 318 using the TMS signal line 306. More specifically, the control device 304 includes programmed data that indicates the size of the information register and data registers employed by the JTAG compatible device 302. Once the number of TDI bits received on the signal line 318 equals the size of the register being loaded (e.g., the instruction register or a data register), the control device 304 knows that a next received bit will be associated with a TMS signal. The control device 304 responds by toggling back to outputting received signals over the TMS signal line 306. The control device 304 will continue to output receive signals using the TMS signal line 306 until finite state machine data received on the signal line 310 indicates one of the two looped states has begun.

Figure 4:
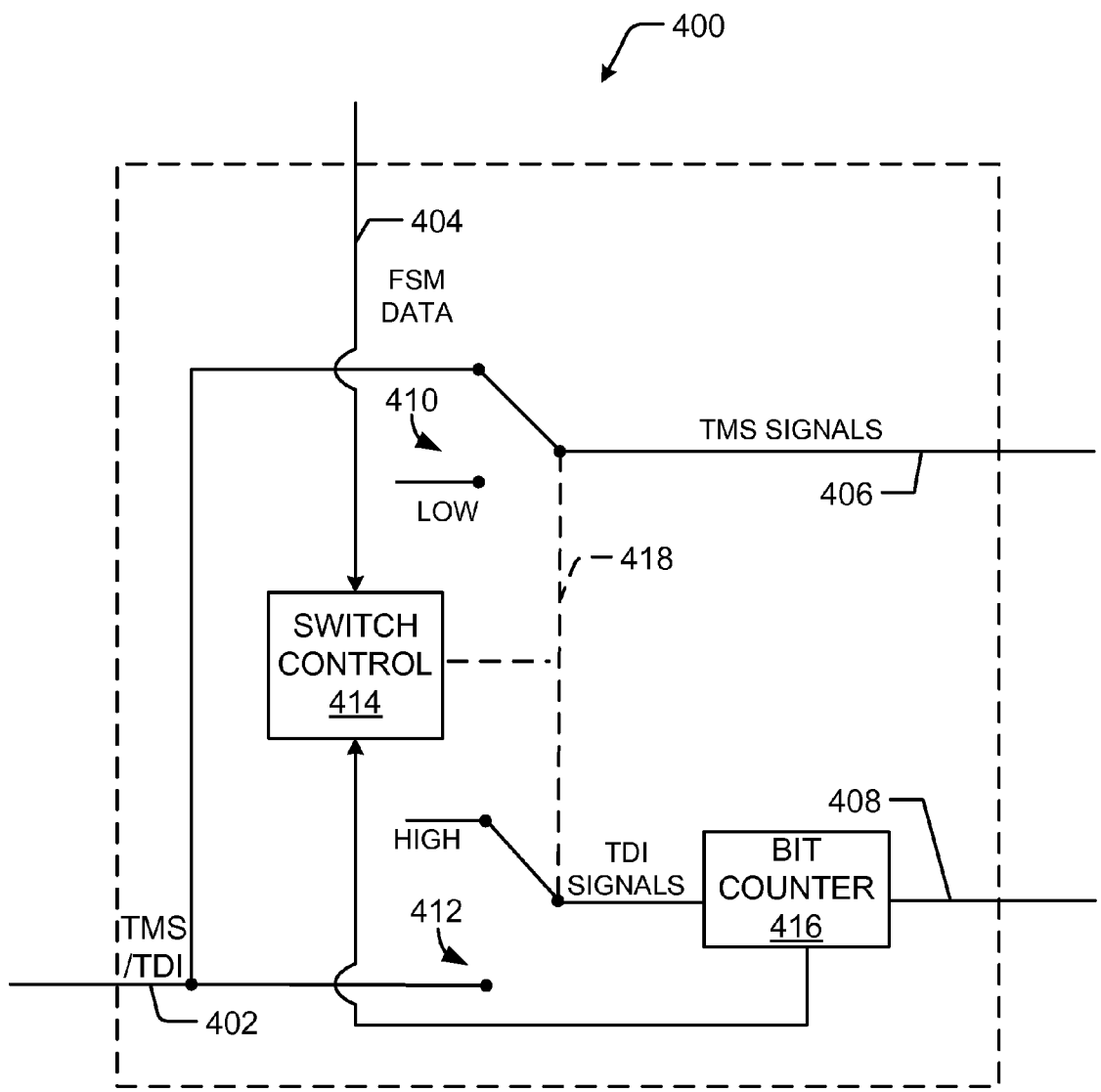
FIG. 4 illustrates an exemplary control device 400 that may be used to reduce the number of pins necessary to produce an improved JTAG compatible device.

FIG. 4 illustrates an exemplary control device 400 that may be used to reduce the number of pins necessary to produce a JTAG compatible device. The control device 400 includes a combined TMS/TDI input signal line 402, a finite state machine data input signal line 404, a TMS output signal line 406 and a TDI output signal line 408. Two switches 410 and 412 are implemented by the exemplary control device 100. The switches 410 and 412 are controlled by a switch control device 414. The switch control device 414 receives two inputs. In particular, one input of the switch control device 414 receives finite state machine data over the finite state machine data signal line 404. Another input of the switch control device 414 receives data from a bit counter 416.

As the default, the TMS/TDI signal line 402 is connected to the TMS output signal line 406 via the switch 410. The control device 400 remains in this state until one of the so-called looped states, (i.e., the shift-DR-state, or the shift-IR state), is indicated by data received on the finite state machine data input signal line 404. One of these looped states causes the switch control device 414 to produce a switching command 418. In this case, the switching command closes the switch 412 and opens a switch 410.

Signals received on the TMS/TDI signal line 402 are now routed through the bit counter 416 and output over the TDI output signal line 408. The bit counter 416 counts the number of bits associated with TDI signals output over the TDI output signal line 408. This count is passed to the control switch 414 over a signal line 420. Once a capacity of a register currently receiving the TDI signals is reached, as indicated by a number of bits counted by the bit counter 416 compared against the size of the register currently receiving the TDI signals, the switch control device 414 produces a switching command 418. In this case, the switching command 418 closes the switch 410 and opens the switch 412. The switch control device 414 may include a nonvolatile or volatile memory to store the physical sizes of registers of one or more of JTAG compatible devices that the exemplary control device 400 may be interfaced with.

Procedure

The following discussion describes procedures that may be realized utilizing the previously described implementations herein. The procedures are illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. In portions of the following discussion, reference may be made to the illustrations of FIGS. 1-4 and the subject matter thereof.

Figure 5:
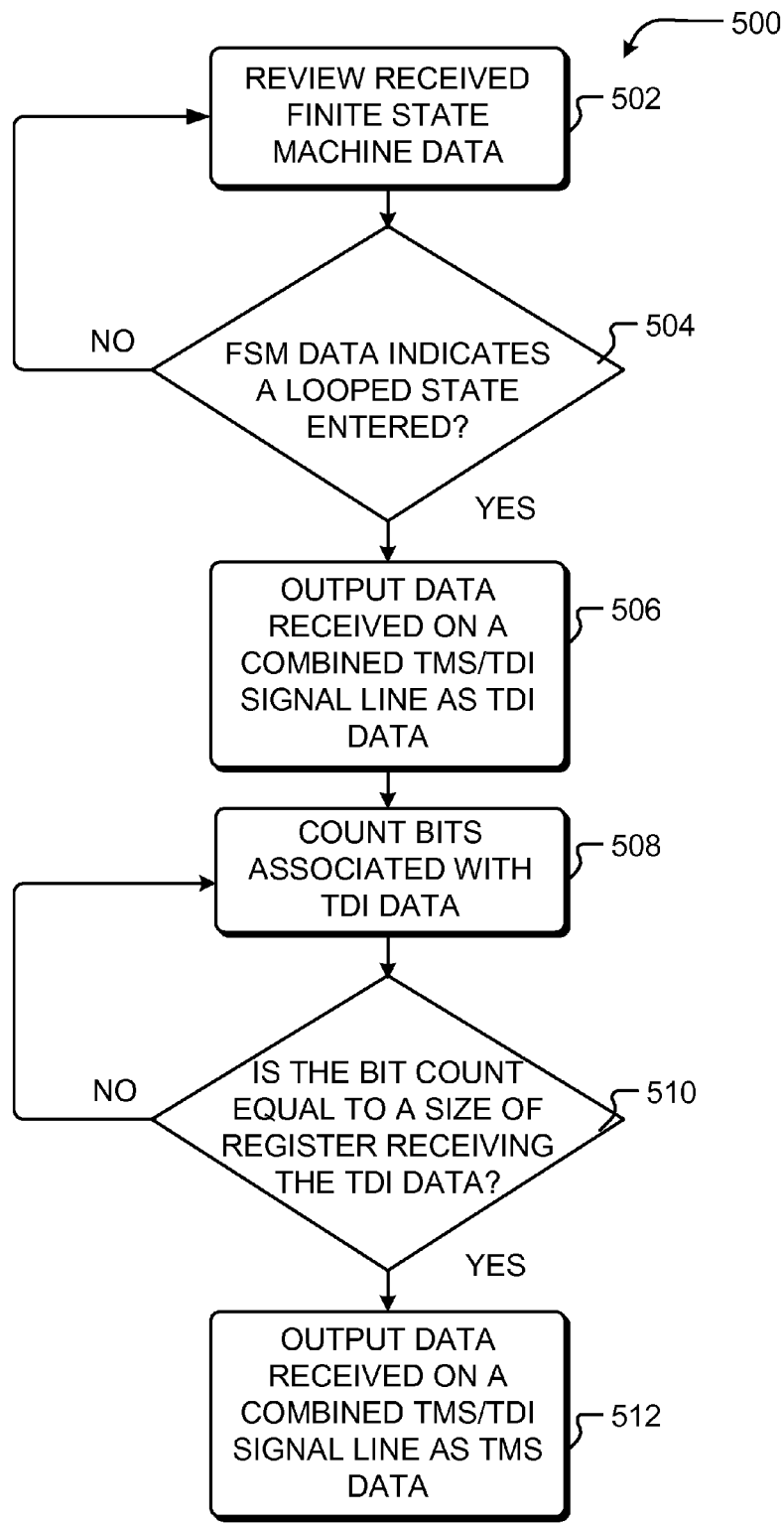
FIG. 5 illustrates a flow diagram that includes a number of operations associated with a control process and/or mechanism that may be used to enable an improved JTAG compatible device.

FIG. 5 illustrates a flow diagram that includes a number of operations 500 associated with a control process and/or mechanism that may be used to enable an improved JTAG compatible device.

At block 502, finite state machine data is reviewed. Such finite state machine data may be received from a JTAG compatible device, such as the JTAG compatible device 302 illustrated in FIG. 3. At block 504, it is determined if the finite state machine data received at the block 502 includes information related to one of the so-called looped states. As was discussed earlier herein, the so-called looped states include, the shift-DR-state and the shift-IR state. If the finite state machine data received at block 502 does not include information that indicates that the finite state machine has reached one of the so-called looped states, the process returns to the block 502.

If the finite state machine data received at block 502 does include information that indicates that the finite state machine has reached one of the so-called looped states, at block 506, data received on a combined TMS/TDI signal line is output as TDI data. At block 508, bits associated with the TDI data are counted. At block 510, it is determined if the number of bits counted equals the size of a register receiving the TDI data. At block 512, once the number of bits counted equals the size of the register receiving the TDI data, data received on a combined TMS/TDI signal line is output as TMS data.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A apparatus, comprising:
   a control device;
   a JTAG compatible device configured to receive a Test Mode Select (TMS) Signal, a Test Data In (TDI) signal, a Test Clock (TCK) signal, and to provide a Test Data Out (TDO) and a finite state machine (FSM) signal;
   the control device includes:
      a first signal input configured to consecutively receive both test mode select (TMS) signals and test data in (TDI) signals in their entirety;
      a second signal input configured to receive the FSM signal provided by the JTAG compatible device;
      a first signal output configured to provide the TMS signal to the JTAG compatible device;
      a second signal output configured to provide the TDI signal to the JTAG compatible device.

2. The apparatus according to claim 1, further comprising at least one additional signal input and a signal output, the at least one additional signal input being an input to receive test clock (TCK) signals and the signal output being an output to receive test data output (TDO) signals.

3. The apparatus according to claim 1, wherein the control device includes a bit counter, the bit counter to count data bits associated with the TDI signals received on the at least one signal input.

4. The apparatus according to claim 1, wherein the control device outputs signals received on the at least one signal input, via the output to output TDI signals when the received FSM data indicates one of a plurality of looped states, the looped states including a shift-DR-state and a shift-IR state.

5. An apparatus, comprising:
   a first input to consecutively receive both test mode select (TMS) signals and test data in (TDI) signals in their entirety;
   a second input to receive finite state machine (FSM) data;
   a first output to output TMS signals received on the first input;
   a second output to output the TDI signals received on the first input; and
   a switch component configured to receive the FSM data and a switch signal;
   the switch component configured to connect the first input to the second output when the FSM data indicates the TDI signal is provided to the first input and to connect the first input to the first output when the switch component is provided the switch signal.

6. The apparatus according to claim 5, wherein the switch component includes two switches, a first of the switches toggleable to connect to the first output and a second of the switches toggleable to connect to the second output.

7. The apparatus according to claim 6, wherein the switch component further includes a switch controller coupled to the two switches, the switch controller to toggle the two switches simultaneously.

8. The apparatus according to claim 6, wherein the switch component further includes a switch controller coupled to the two switches, the switch controller to toggle the two switches based at least on the FSM data.

9. The apparatus according to claim 6, wherein the switch component further includes a switch controller coupled to two switches, the switch controller to toggle the two switches based on the FSM data and data bit counts.

10. The apparatus of claim 5, further comprising:
a bit counter component configured to count a number of bits received by the second output and to provide the switch signal to the switch component when the number of bits received by the second output reaches a threshold amount.

11. A method, comprising:
Receiving, in their entirety, both test mode select (TMS) signals and test data in (TDI) signals consecutively on a single input a control device;
receiving finite state machine data (FSM) into the control device provided by a JTAG device, the finite state machine data indicates the TDI signals are being provided to the single input of the control device;
outputting the TDI signals to the JTAG device.

12. The method according to claim 11, further comprising reviewing received FSM data in the control device to determine a current state of a JTAG compatible device.

13. The method according to claim 11, further comprising outputting received data as the TDI data, and counting bits associated with the TDI data in the control device.

14. The method according to claim 13, further comprising outputting from the control device the received data as the TMS data when data bits associated with the TDI data equal a size of a register to receive the TDI data.

* * * * *